(12) United States Patent
Gonzalez et al.

(10) Patent No.: US 7,659,152 B2
(45) Date of Patent: Feb. 9, 2010

(54) LOCALIZED BIASING FOR SILICON ON INSULATOR STRUCTURES

(75) Inventors: Fernando Gonzalez, Boise, ID (US); John K. Zahurak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 10/930,001

(22) Filed: Aug. 30, 2004

(65) Prior Publication Data

US 2005/0032284 A1 Feb. 10, 2005

Related U.S. Application Data

(62) Division of application No. 10/230,938, filed on Aug. 29, 2002.

(51) Int. Cl.
*H01L 21/84* (2006.01)
(52) U.S. Cl. .............................. 438/155; 257/E21.561
(58) Field of Classification Search ......... 438/151–166; 257/E21.561
See application file for complete search history.

(56) References Cited

U.S. PATENT DOCUMENTS

| | | | | |
|---|---|---|---|---|
| 4,035,198 | A | * | 7/1977 | Dennard et al. ............. 438/297 |
| 4,612,629 | A | | 9/1986 | Harari .................... 365/185.08 |
| 4,679,300 | A | * | 7/1987 | Chan et al. .................. 438/246 |
| 4,700,454 | A | * | 10/1987 | Baerg et al. ................. 438/297 |
| 4,749,660 | A | * | 6/1988 | Short et al. ................. 438/766 |
| 4,891,329 | A | | 1/1990 | Reisman et al. ............. 438/459 |
| 5,298,449 | A | | 3/1994 | Kikuchi ....................... 438/459 |
| 5,374,564 | A | | 12/1994 | Bruel .......................... 438/455 |
| 5,374,581 | A | | 12/1994 | Ichikawa et al. ............. 438/459 |
| 5,741,733 | A | | 4/1998 | Bertagnolli et al. |
| 5,770,483 | A | * | 6/1998 | Kadosh et al. ............... 438/152 |
| 5,852,310 | A | * | 12/1998 | Kadosh et al. ................. 257/67 |
| 5,855,693 | A | | 1/1999 | Murari et al. .............. 148/33.3 |
| 5,877,070 | A | | 3/1999 | Goesele et al. .............. 438/458 |
| 5,882,987 | A | | 3/1999 | Srikrishnan et al. ......... 438/458 |
| 5,894,152 | A | | 4/1999 | Jaso et al. .................... 257/347 |
| 5,945,712 | A | * | 8/1999 | Kim ............................ 257/347 |

(Continued)

FOREIGN PATENT DOCUMENTS

GB 2337851 12/1999

OTHER PUBLICATIONS

Yang, I. Y., et al., "Silicon-on-insulator-with-active-substrate (SOIAS) technology", *1996 IEEE International SOI Conference, 1996. Proceedings.*, (1996), 106-107.

(Continued)

*Primary Examiner*—Richard A. Booth
(74) *Attorney, Agent, or Firm*—Schwegman, Lundberg & Woessner, P.A.

(57) ABSTRACT

A silicon-on-insulator device has a localized biasing structure formed in the insulator layer of the SOI. The localized biasing structure includes a patterned conductor that provides a biasing signal to distinct regions of the silicon layer of the SOI. The conductor is recessed into the insulator layer to provide a substantially planar interface with the silicon layer. The conductor is connected to a bias voltage source. In an embodiment, a plurality of conductor is provided that respectively connected to a plurality of voltage sources. Thus, different regions of the silicon layer are biased by different bias signals.

40 Claims, 6 Drawing Sheets

U.S. PATENT DOCUMENTS

| | | | | |
|---|---|---|---|---|
| 5,953,622 | A | | 9/1999 | Lee et al. ............... 438/458 |
| 5,998,808 | A | * | 12/1999 | Matsushita ............... 257/74 |
| 6,004,406 | A | | 12/1999 | Kobayashi et al. ......... 148/33.3 |
| 6,049,110 | A | | 4/2000 | Koh |
| 6,083,324 | A | | 7/2000 | Henley et al. ............ 148/33.2 |
| 6,150,031 | A | | 11/2000 | Yonehara ................. 428/446 |
| 6,245,161 | B1 | | 6/2001 | Henley et al. ............ 148/33.4 |
| 6,251,754 | B1 | | 6/2001 | Ohshima et al. ........... 438/506 |
| 6,291,858 | B1 | | 9/2001 | Ma et al. |
| 6,465,331 | B1 | | 10/2002 | Keeth et al. |

OTHER PUBLICATIONS

*The American Heritage Dictionary of the English Language, Third Edition copyright 1992 by Houghton Miffin Company.*, Electronic Version Licensed from INSO Corporation.

"U.S. Appl. No. 10/230,938 Advisory Action mailed Jul. 13, 2004", 3 pgs.

"U.S. Appl. No. 10/230,938 Advisory Action mailed Aug. 11, 2006", 5 pgs.

"U.S. Appl. No. 10/230,938 Final Office Action May 3, 2006", 17 pgs.

"U.S. Appl. No. 10/230,938 Final Office Action mailed Mar. 24, 2004", 22 pgs.

"U.S. Appl. No. 10/230,938 Final Office Action mailed Apr. 6, 2005", 20 pgs.

"U.S. Appl. No. 10/230,938 Non Final Office Action mailed Jul. 9, 2003", 18 pgs.

"U.S. Appl. No. 10/230,938 Non Final Office Action mailed Sep. 6, 2006", 22 pgs.

"U.S. Appl. No. 10/230,938 Non Final Office Action mailed Oct. 1, 2004", 21 pgs.

"U.S. Appl. No. 10/230,938 Non Final Office Action mailed Nov. 4, 2005", 24 pgs.

"U.S. Appl. No. 10/230,938 Notice of Allowance mailed Mar. 29, 2007", 8 pgs.

"U.S. Appl. No. 10/230,938 Notice of Allowance mailed Aug. 22, 2007", NOAR,5 pgs.

"U.S. Appl. No. 10/230,938 Response filed Jan. 3, 2005 to Non Final Office Action mailed Oct. 1, 2004", 16 pgs.

"U.S. Appl. No. 10/230,938 Response filed Feb. 6, 2006 to Non Final Office Action mailed Nov. 4, 2005", 19 pgs.

"U.S. Appl. No. 10/230,938 Response filed Jun. 22, 2004 to Final Office Action mailed Mar. 24, 2004", 20 pgs.

"U.S. Appl. No. 10/230,938 Response filed Jul. 3, 2006 to Final Office Action May 3, 2006", 16 pgs.

"U.S. Appl. No. 10/230,938 Response filed Oct. 5, 2005 to Final Office Action mailed Apr. 6, 2005", 18 pgs.

"U.S. Appl. No. 10/230,938 Response filed Dec. 6, 2006 to Non Final Office Action mailed Sep. 6, 2006", 18 pgs.

"U.S. Appl. No. 10/230,938 Response filed Dec. 9, 2003 to Non Final Office Action mailed Jul. 9, 2003", 20 pgs.

* cited by examiner

LOCALIZED BIASING FOR SILICON ON INSULATOR STRUCTURES

RELATED APPLICATIONS

This application is a Divisional of U.S. application Ser. No. 10/230,938, filed Aug. 29, 2002, which is incorporated herein by reference.

The present application is generally related to U.S. application Ser. No. 09/651,484, filed Aug. 30, 2000, now U.S. Pat. No. 6,429,070, which is hereby incorporated by reference for any purpose.

FIELD OF THE INVENTION

The present invention relates to silicon on insulator structures and methods for fabricating the silicon on insulator structures.

BACKGROUND

Technologies referred to as "smart cut" and "wafer-bonding" have been utilized to bond monocrystalline silicon materials onto semiconductor substrates. Smart cut technology generally refers to a process in which a material is implanted into a silicon substrate to a particular depth and ultimately utilized to crack the substrate, and wafer bonding technology generally refers to a process in which a first semiconductive substrate is bonded to a second semiconductor substrate.

In particular applications of smart cut and wafer-bonding technology, hydrogen ions (which can be, for example, $H^+$, $H_2^+$, $D^+$, $D_2^+$) are implanted into a first monocrystalline silicon substrate to a desired depth. The first monocrystalline silicon substrate comprises a silicon dioxide surface, and is bonded to a second monocrystalline substrate through the silicon dioxide surface. Subsequently, the bonded first substrate is subjected to a thermal treatment, which causes cleavage along the hydrogen ion implant region to split the first substrate at a pre-defined location. The portion of the first substrate remaining bonded to the second substrate can then be utilized as a silicon-on-insulator ("SOI") substrate. An example of a process is described in U.S. Pat. No. 5,953,622, hereby incorporated by reference. The SOI substrate is subsequently annealed at a temperature of greater than or equal to 900° C. to strengthen chemical coupling within the second substrate.

While silicon-on-insulator (SOI) structures offer a solution to some problems with semiconductor processing, SOI structures introduce a floating body effect. The floating body effect occurs when the body of a FET floats toward Vdd and the threshold voltage reduces. A reduction in the threshold voltage increases the sensitivity of the FET to noise in its input.

Silicon-on-insulator structures further introduce the drawback of kinks. A discussion of "kink" effect is found in "Analysis of kink characteristics in silicon-on-insulator MOSFET's using two-carrier modeling", IEEE JSSC, vol. SC-20, no. 1, February 1985, pgs. 378-382, by Koichi Kato, Tetsunori Wada, and Kenji Taniguchi, hereby incorporated by reference.

SUMMARY

The present invention includes a conductor formed in the insulator layer in a silicon-on-insulator ("SOI") structure. The present invention also includes methods for fabricating the conductor in the SOI structure. An embodiment of the present invention includes a silicon-on-insulator semiconductor device. The SOI device includes a conductor in the insulator layer. The conductor is electrically connected to a region of the silicon layer and is adapted to bias the region. In an embodiment, the SOI device includes a substrate, an insulator on the substrate, a patterned conductor in the insulator, and a silicon layer formed on the insulator and the patterned conductor. At least one integrated circuit device is formed in the silicon layer. In an embodiment, the integrated circuit device in the silicon layer is a transistor that has a body region in contact with the conductor. In an embodiment, the conductor is adapted to provide a bias voltage to devices formed on or in the silicon layer overlying the insulator layer. The conductor is adapted, in an embodiment, to bias the body region of the transistor. The patterned conductor is adapted to provide a bias voltage to at least a portion of the silicon layer. In an embodiment, the bias voltage provided by the conductor is only applied to a portion of the silicon layer. In an embodiment, the substrate has other integrated circuit structures such as at least one second integrated circuit device. The insulator is formed on the at least one second integrated circuit device. The integrated circuit structures in the substrate include electrical energy storage devices. In an embodiment, the integrated circuit structures in the substrate include capacitors. In an embodiment, the conductor includes polysilicon. In an embodiment, the insulator includes a buried oxide that is adapted to electrically isolate the patterned conductor from at least one second integrated circuit.

In an embodiment, the conductor is connected to at least one voltage source to provide a biasing voltage that is delivered to the conductor to the body regions in the silicon layer. In an embodiment, the conductor is divided into a plurality of separate conductors that are respectively connected to different voltage sources. Thus, a plurality of different biasing voltages is supplied to the silicon layer.

In an embodiment, the insulator layer of the SOI device includes a recess therein. The recess is patterned such that it extends only under certain regions of the yet to be formed silicon layer. A conductive material is deposited in the recess.

The present invention further includes a method for forming a SOI structure having a conductor in the insulator layer. An embodiment of the method of forming a silicon-on-insulator structure includes providing a silicon-on-insulator substrate, forming a recess in an insulator layer, depositing a conductor in the recess, and forming a semiconductor device over the conductor. In an embodiment, etching into the buried oxide layer forms the recess. In an embodiment, depositing a conductive polysilicon in the recess forms the conductor. In an embodiment, a body region of the semiconductor device electrical contacts the conductor, the conductor being adapted to provide a biasing voltage to the body region. In an embodiment, the substrate layer of the SOI device includes further integrated circuit devices such as capacitors and transistors. In an embodiment, an upper surface of the conductor and insulator layer is planarized. In an embodiment, a recess is formed in the insulator layer to a depth of about 500 angstroms.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the

DESCRIPTION

In the following detailed description of the invention, reference is made to the accompanying drawings, which form a part hereof, and in which are shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. The term substrate is also understood to include silicon on insulator structures. Both wafer and substrate include doped and undoped semiconductors, epitaxial semiconductor layers supported by a base semiconductor or insulator, as well as other semiconductor structures known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, fabrication of films on substrates, devices and systems for such fabrication, media containing instructions therefor, and integrated circuit devices produced according to the present invention are described.

The present description uses a reference number convention of the first digit corresponding to the figure in which the number references and the last two digits corresponding to like elements throughout the description. For example, the silicon-on-insulator (SOI) integrated circuit structure is designated by a reference number of X00, where X is the number of figure on which the reference number refers.

Figure 1:
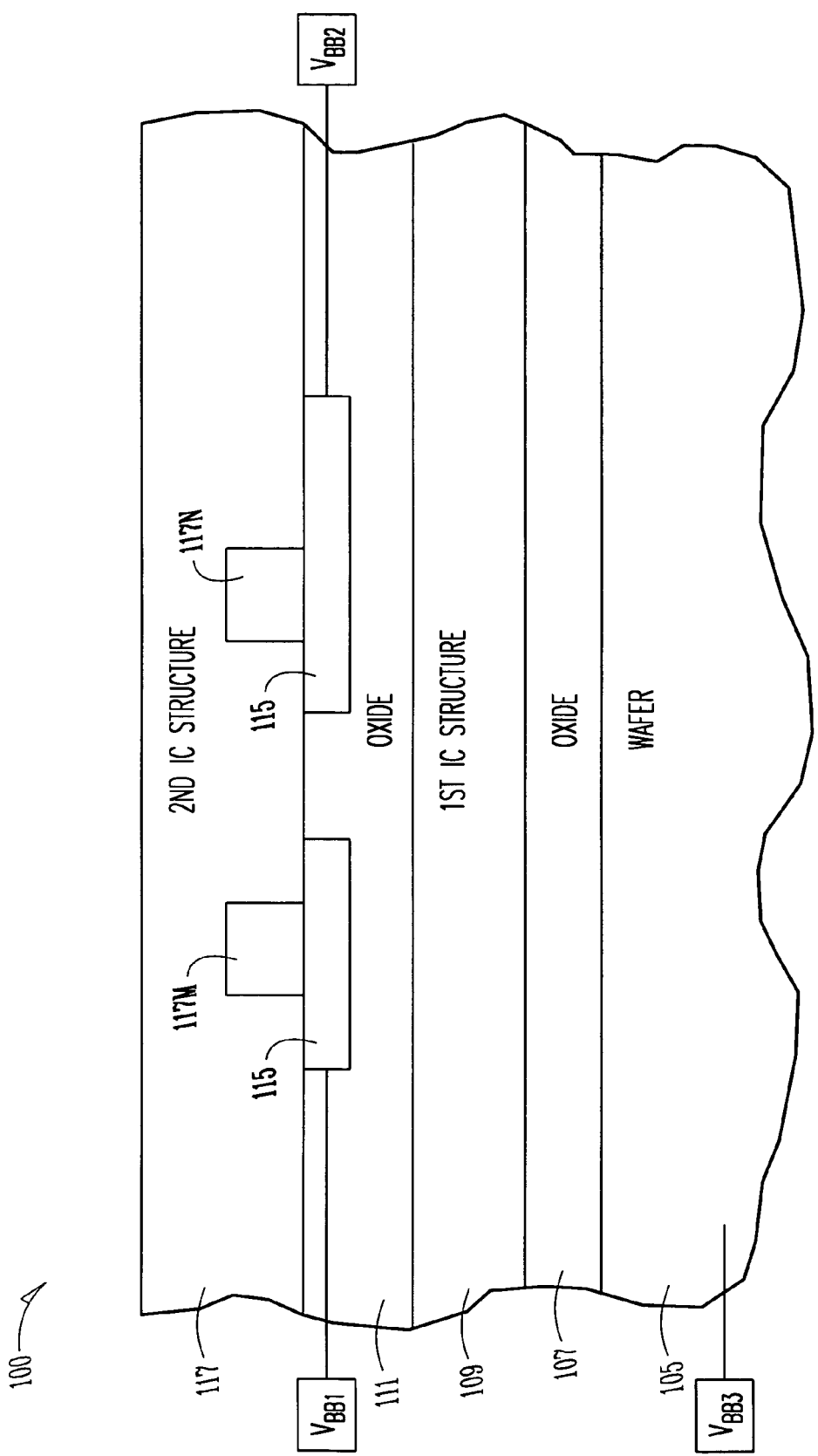
FIG. 1 is a fragmentary cross-sectional view of a semiconductor structure according to the present invention.

FIG. 1 depicts a silicon-on-insulator (SOI) integrated circuit structure 100. Structure 100 includes a substrate 105. In an embodiment, the substrate 105 is a semiconductor substrate. In an embodiment, the substrate 105 is a semiconductive material wafer. The substrate comprises, for example, monocrystalline silicon lightly doped with a background p-type dopant. Semiconductors include, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described herein.

A first insulative material layer 107 is formed over substrate 105. It is noted that for purposes of interpreting this disclosure and the claims that follow, the spacial reference terms "over", "above", "beneath" and the like are utilized to describe relative orientations of various components to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials. Insulative material layer 107, in an embodiment, includes a layer of silicon dioxide.

A first integrated circuit structure 109 is formed on the insulative material layer 107. The first integrated circuit structure 109 includes integrated circuit devices, for example, memory cells and/or logic circuits. In an embodiment, the first integrated circuit layer 109 includes capacitors. In an embodiment, the capacitors are formed according to the steps described in co-pending application Ser. No. 09/651,484, titled DRAM CELL CONSTRUCTIONS, AND METHODS OF FORMING DRAM CELLS, assigned to the Micron Technology, Inc., the assignee of the present application. Application Ser. No. 09/651,484 is hereby incorporated by reference for any purpose. In an embodiment, the first integrated circuit layer 109 includes transistors. The transistors, in an embodiment, are access transistors for use in memory cells.

In an embodiment of the invention, the first IC structure 109 is formed on the substrate 105. That is, the insulative layer 107 is not between the substrate 105 and the first IC structure 109.

A second insulative layer 111 is formed over the first IC structure 109. In an embodiment, layer 111 includes an insulative oxide layer. Insulative layer 111, in an embodiment, includes a layer of silicon dioxide. A biasing layer 115 is formed in the insulative layer 111. A second integrated circuit structure 117 is formed over the second insulative layer 111 and the biasing layer 115. The second integrated circuit structure 117 includes integrated circuit devices, for example, memory cells and/or logic circuits. In an embodiment, the integrated circuit layer 117 includes capacitors. In an embodiment, the integrated circuit layer 117 includes transistors. The transistors, in an embodiment, are formed according to the methods described in the application Ser. No. 09/651,484. Layer 117 includes, in an embodiment, at least two integrated circuit devices 117M, 117N. It will be appreciated that the bias layer 115 is formable in any of the insulative layers shown in application Ser. No. 09/651,484 to provide a bias voltage to select regions of the silicon layer, which regions are above the bias layer 115.

The biasing layer 115 is conductive to deliver a potential to a substrate region of an integrated circuit device such as a transistor. Biasing layer 115, in an embodiment, is a back bias layer that biases the base or substrate of an integrated circuit device. In an embodiment, the biasing layer 115 is conductively doped polysilicon. The biasing layer 115 is patterned so that is extends under select ones or groups of integrated circuit devices 117M, 117N of the second integrated circuit structure 117. The biasing layer 115 is adapted to provide a back bias voltage (Vbb) to a substrate region associated with the integrated circuit devices 117M, 117N. Vbb is typically below the common ground for the integrated circuit devices 117M, 117N. That is, if the common ground is held at zero volts, then Vbb is held at a negative voltage. A biased substrate gives better control over threshold voltages, reduces transistor leakage, and guards against latch-up. However, the SOI structure 100 includes a substrate 105 separated from the second IC structure 117 by a plurality of layers. Thus, biasing the substrate 105 does not affect the integrated circuit devices 117M, 117N. An embodiment of the present invention provides for a bias layer 115 beneath at least one of the integrated circuit devices 117N that are formed in the semiconductor layer overlying the insulator layer.

In an embodiment, the biasing layer 115 includes a plurality of sub-layers that are electrically open to at least one other sub-layer. These sub-layers are connected to a voltage other than Vbb to provide different voltages beneath select groups of integrated circuit devices in the silicon layer 117 above the insulator layer 111. That is, the back bias layer 115 beneath integrated circuit device 117M is not electrically connected to the back bias layer beneath integrated circuit device 117N. Accordingly, different back bias voltages are provided to different groups of integrated circuit devices in second IC layer 117. For example, the voltage source $V_{BB1}$ is connected to the bias layer 115 beneath integrated circuit device 117M. The voltage source $V_{BB2}$ is connected to the bias layer 115 beneath integrated circuit device 117N. The voltage source $V_{BB3}$ is connected to the substrate 105. The substrate 105 is biased by voltage source $V_{BB3}$. For example, in an embodiment without the oxide layer 107, the substrate is biased by $V_{BB3}$. That is, the first IC structure 109 is formed on the substrate 105. At least one of the three voltage sources $V_{BB1}$, $V_{BB2}$, and $V_{BB3}$ provide a different bias voltage than the other two voltage sources. Supplying different back bias voltages are used in system on a chip applications that have different integrated circuit devices formed in the various silicon layers, e.g., 105, 109, and/or 117. When different logic circuits, solid-state switches, or transistors that are formed in the silicon layers require or would have improved operation with different back bias voltages, then the bias layer is formed beneath the silicon layers 109, 117 in the insulative layers 107, 111 to provide different bias voltages to the select regions of the silicon layers.

Figure 2:
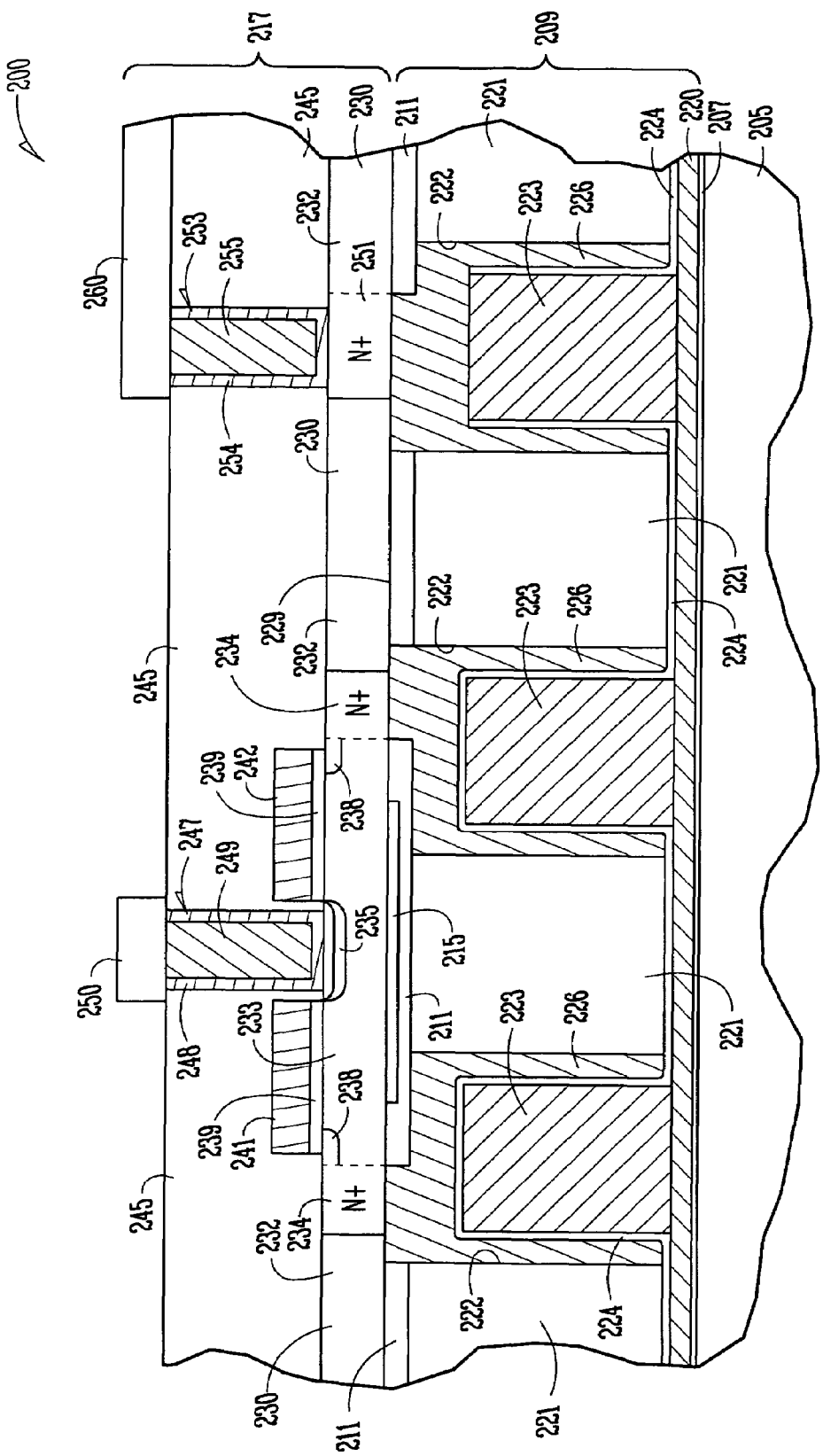
FIG. 2 is a fragmentary cross-sectional view of a semiconductor structure according to the present invention.

FIG. 2 depicts a SOI structure 200 according to an embodiment of the present invention. SOI structure 200 includes a substrate 205 on which is formed an insulative material layer 207. In an embodiment, substrate 205 includes a monocrystalline silicon. An integrated circuit structure 209 is formed over the insulative layer 207. An insulator layer 211 is formed on the IC structure 209. A conductive, biasing layer 215 is formed in the insulator layer 211. A further integrated circuit structure 217 is formed on the insulator layer 211 and the conductive, biasing layer 215.

An embodiment of the integrated circuit structure 209 will now be described. Structure 209 includes a conductive material layer 220 formed over insulative layer 207. The conductive material layer 220, in embodiments of the present invention, comprises, for example, metal, silicide, and/or conductively-doped silicon (such as, for example, conductively doped polysilicon). An insulative material layer 221 is formed over conductive material layer 220. Insulative material layer 221 comprises, in an embodiment, borophosphosilicate glass (BPSG), and has a thickness of, for example, from about 1 microns to about 4 microns. Openings 222 are formed within insulative material layer 221 and extend through insulative material layer 221 to conductive material layer 220. A second conductive material 223 is formed over and on first conductive material 220 in the openings 222. Second conductive material 223, in an embodiment, comprises the same composition as first conductor material 220. In an embodiment, second conductive material 223 includes a metal. In an embodiment, second conductive material 223 includes a metal silicide. In an embodiment, second conductive material 223 includes a conductively doped silicon (such as, for example, conductively-doped polysilicon). Conductive material 223 is patterned as pedestals, which form projections extending from about 1 micron to about 4 microns above an upper surface of conductive material 220. In an embodiment, material 223 is patterned into the pedestals by, for example, forming a layer of material 223 over layer 221, and subsequently providing a patterned layer of photoresist over the material 223 and transferring a pattern from the photoresist to material 223 with a suitable etch. The photoresist is then be removed to leave patterned structures or projections of material 223 that have sidewalls extending upwardly from layer 220. The projections of layer 223 include substantially planar upper surfaces.

A dielectric material layer 224 is formed over the conductive material layer 223. In an embodiment, dielectric material layer 224 extends over the projections of conductive layer 223, and specifically is formed along the sidewalls and over the upper surfaces of the projections. Dielectric material layer 224, in an embodiment, includes silicon dioxide. In an embodiment, dielectric material layer 224 includes silicon nitride. In an embodiment, dielectric material layer 224 includes a layer of silicon nitride between two layers of silicon dioxide. The dielectric material may include other dielectric materials known to one of skill in the art. Dielectric material layer 224 is patterned such that it extends along sidewalls of the rightmost projection of FIG. 2, but does not extend over a top surface of this projection.

A conductive material layer 226 is formed over dielectric material layer 224. The prior or below layers are covered with the material conductive layer 226, which is then patterned and etched to that it has the shape shown in FIG. 2. Thus, the leftmost and center structures, which each include a portion of conductive layer 223, dielectric layer 224 and a portion of conductive layer 226, each form an electric storage device, i.e., a capacitor. A plurality of such capacitors forms an IC memory array. The rightmost structure as shown in FIG. 2, includes a portion of the conductive layer 226 in electrical contact with conductive layer 223, i.e., the dielectric layer 224 is removed from between layers 223, 226, to form a conductive interconnect. The conductive interconnect connects to the capacitors through the conductive layer 220. The conductive interconnect is adapted to transfer voltage to the layer 220, which acts as a cell plate.

It will be recognized that the capacitors and interconnects can be formed prior to the insulative layer 221. In this embodiment, the volumes between the capacitors and interconnects are now filled with an insulative layer.

The upper surface of the insulative layer 221 and conductive layer 226 are subsequently planarized. The planarization, in an embodiment, includes chemical-mechanical polishing, and forms a planarized upper surface. It is noted that the planarization can also remove some of conductive material layer 226 during the formation of planarized upper surface. In an embodiment, the upper surface of the insulative layer 221 and conductive layer 226 are patterned to form a stepped upper surface that includes recesses.

The insulative layer 211 is formed over the upper surface of the conductive layer 226 and insulative layer 221. In an embodiment, the upper surface is patterned by removing a portion of the layers 226 and 221 as shown in FIG. 2. Insulative layer 211, in an embodiment, is an oxide. In a particular embodiment, the layer 211 is a buried oxide (BOX) in the SOI structure 200. The insulative layer 211 is selectively deposited such that at least a portion of the conductive layer 226 extends through the insulative layer 211 to provide electrical connection between the first IC structure 209 and the second IC structure 217. In an embodiment, insulative layer 211 is first deposited to completely cover the prior layers and then selectively etched to allow at least a portion of the conductive layer 226 to be in electrical contact with the second IC structure 217.

A conductive layer 215 is formed in the insulative layer 211. The conductive layer 215, in an embodiment, includes doped polysilicon. In an embodiment, the insulative layer 211 is masked and etched to form at least one patterned recess therein. The conductive layer 215 is deposited in the recesses of the insulative layer 211. In an embodiment, the conductive layer 215 is a polysilicon. In an embodiment, the polysilicon is doped. In an embodiment, the polysilicon includes a p-type dopant. In an embodiment, the polysilicon includes an n-type dopant. The conductive layer is then planarized such that an upper surface 229 of the conductive layer 215, insulative layer 211 and portion of layer 226 that extends through insulative layer 211 is planar. This top surface provides a uniform and planar surface on which the upper integrated circuit structure 217 is formed.

An embodiment of the integrated circuit structure 217 will now be described. Structure 217 includes a silicon layer 230 formed over the upper surface 229. In an embodiment, the silicon layer 230 is bonded over insulator layer 211 according to silicon on insulator technology. Portions of the silicon layer 230 are formed into isolation regions 232. In an embodiment, isolation regions 232 are field oxide regions. In an embodiment, the field oxide regions 232 are formed by LOCOS. In an embodiment, the field oxide regions 232 are STI regions. A transistor base 233 is formed in the silicon layer 230. Base 233 is directly over and in electrical contact with the conductive layer 215. Portions of the silicon layer 230 adjacent isolation regions 232 and base 233 are formed into source/drain regions 234. In an embodiment, the source/drain regions 234, 235 are formed by selectively doping the silicon layer 230. In an embodiment, the regions 234 are doped as an N+ region. In an embodiment, the base 233 is a P type region. Lightly doped regions 238 are formed in the silicon layer 230 adjacent the source/drain regions 234. Gate oxide layer 239 is formed on the silicon layer 230. Transistor gates 241 and 242 are formed over the gate oxide 239 intermediate the source/drain regions 234 and drain/source region 235. Transistor gates 241, 242 are conductive. In an embodiment, sidewall spacers (not shown) are adjacent transistor gates 241, 242.

The insulative layer 211 is made thick enough so that if any defects are present in the layer 211, the conductive layer 215 does not short to the source/drain regions 234. In an embodiment, the insulative layer 211 is about 200 angstroms to 1,000 angstroms thick. In an embodiment, insulative layer 211 is thicker than about 500 angstroms. Further, the conductive layer 215 is positioned inwardly from the edges of the insulative layer 211 adjacent the source/drain regions 234 to further assist the isolation of the conductive layer 215 from the source/drain regions 234 and other conductive structures in the IC layer 217. Moreover, the silicon layer 230 is made thick enough to prevent the conductive regions of the silicon layer from influencing the conductive layer 215 or vice versa except to bias the base region 233.

An insulative material 245 is formed over transistor gate 241 and 242. A conductive bitline interconnect 247 is formed to extend through insulative material 245 and to source/drain region 235. Conductive interconnect 247 is shown comprising a pair of conductive layers 248, 249. Outer layer 247, in an embodiment, includes a metal nitride. In an embodiment, outer layer 247 is titanium nitride. Inner layer 249, in an embodiment, includes a metal. In an embodiment, inner layer 249 is tungsten. A bitline 250 is shown formed and patterned over insulative material 245.

Structure 200 electrically isolates the capacitors of the bottom integrated circuit layer 209 from a bottom monocrystalline substrate 205. Thus, there is increased tolerance for defects in the bottom monocrystalline substrate. Structure 200 further provides the integrated circuit layer 217 over the isolation layer 211 that is on the bottom integrated circuit layer 209. Moreover, base-biasing layer 215 is adapted to provide a base basis voltage to the base 233 in the upper integrated circuit layer 217. Accordingly devices of the present invention can have advantages of SOI, without being conventional SOI structures that have floating body effects.

A further conductively doped region 251 is formed in silicon layer 230. Region 251 is formed directly on and in electrical contact with the rightmost portion of conductive layer 226 as shown in FIG. 2. A conductive interconnect 253 is formed to extend through insulative material 245 to conductive region 251. Conductive interconnect 253 is shown comprising a pair of conductive layers 254, 255. Outer layer 254, in an embodiment; includes a metal nitride. In an embodiment, outer layer 254 is titanium nitride. Inner layer 255, in an embodiment, includes a metal. In an embodiment, inner layer 255 is tungsten. An electrical connection 260 is shown formed and patterned over interconnect 253. In an embodiment, electrical connection includes a metal. Electrical connection 260 is adapted to provide voltage to conductive layer 220 (through conductive materials 255, 254, 251, 226, and 223), and accordingly to power a capacitor plate (shown as the two leftmost portions of layer 223) associated with capacitor structures.

Figure 3:
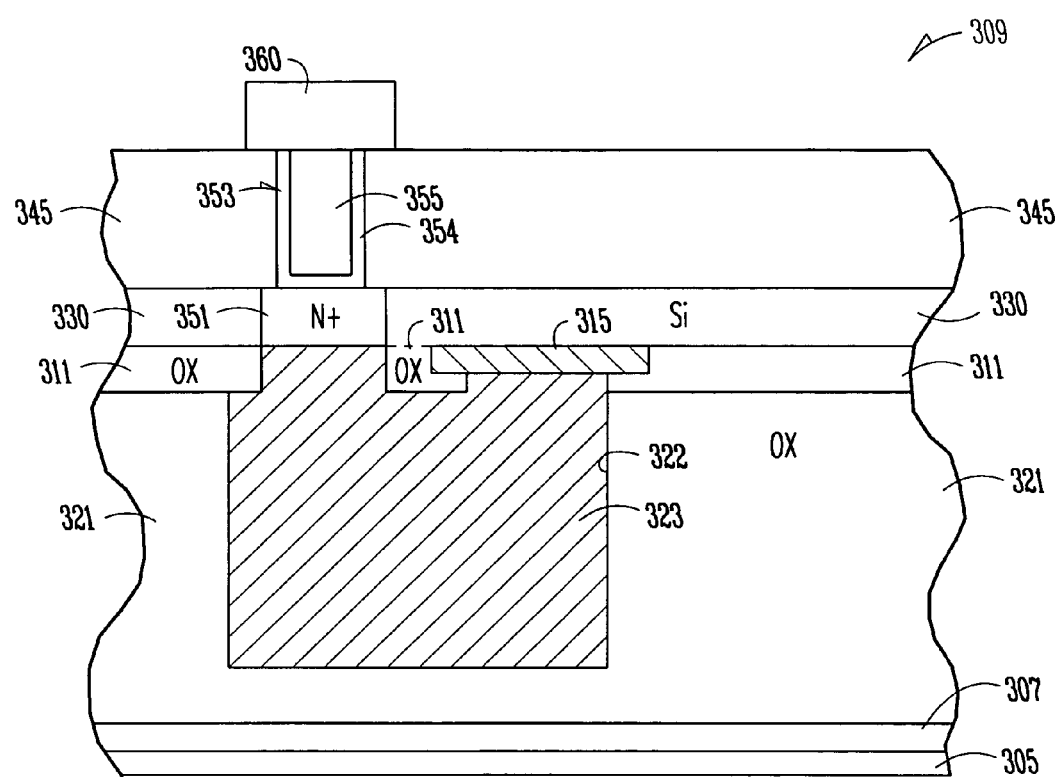
FIG. 3 is a fragmentary cross-sectional view of a semiconductor structure according to the present invention.

FIG. 3 shows an SOI structure 300 according to an embodiment of the invention. Structure 300 includes a substrate 305 and an insulator layer 307 formed on the substrate 305. A conductive layer 323 is formed in a recess 322 formed in a further insulator layer 321 on the insulator layer 307. Conductive layer 323 is masked and etched to have the two recesses and a four level upper surface as shown in FIG. 3. A further insulator layer 311 is formed on the insulator layer 321 the conductive layer 323. In a particular embodiment, the layer 311 is a buried oxide ("BOX") in the SOI structure 300. Insulator layer 311 is masked and etched to form a recess therein. A conductive layer 315 is formed in the insulator layer recess. It is within the scope of the present invention to first deposit the materials for the described layers and then mask and etch the material to form the deposited material layer into the formations shown and/or described. It is also with in the scope of the present invention to form a sacrificial layer patterned as a negative of the desired material layer. And then the material layer is deposited on the patterned sacrificial layer. Thereafter, the sacrificial layer is stripped. This leaves the desired pattern of the material layer. The conductive layer 315 is part of a biasing layer of the present invention. Conductive biasing layer 315 is in electrical communication with the conductive layer 323. In an embodiment, the conductive layer 315 is deposited directly on a portion of conductive layer 323.

A layer of semiconductor material 330 is formed over the insulative (BOX) layer 311 and the conductive layer 315. In an embodiment, the semiconductor layer 330 is formed of silicon. A region 351 of the silicon is doped to form a conductive interconnect to the conductive layer 323. Other portions of the silicon are doped at the same time to form other conductive regions in layer 330 in an embodiment. In an embodiment, the semiconductor is etched and a conductive material is deposited in the etched recess to form conductive region 351. An insulative layer 345 is formed on the semiconductor layer 330. A conductive interconnect 353 is formed to extend through insulative material 345 and to conductive region 351. Conductive interconnect 353 is shown comprising a pair of conductive layers 354, 355. Outer layer 354, in an embodiment, includes a metal nitride. In an embodiment, outer layer 354 is titanium nitride. Inner layer 355, in an embodiment, includes a metal. In an embodiment, inner layer 355 is tungsten. An electrical connection 360 is shown formed and patterned over interconnect 353. In an embodiment, electrical connection includes a metal. In an embodiment, connection 360 includes an aluminum trace. Electrical connection 360 is adapted to provide voltage to conductive layer 315 (through conductive materials 355, 354, 351, and 323). Thus, this structure provides an electrical connection to a voltage source. In an embodiment, the voltage source is fixed. In an embodiment, the voltage source is grounded. In an embodiment, the voltage source is a booted voltage source. In an embodiment, the electrical connection 360 connects one of $V_{BB1}$ and $V_{BB2}$ as described with FIG. 1 to the conductive, biasing layer 315.

An embodiment of the present invention further provides interconnects 247 to the transistors, interconnects 253 to control lines, and interconnects 353 to the conductive layer 115, 215, or 315 that are implanted with a single set of implant processing steps. Stated another way, interconnects 247, 253 and 353 are created at the same time to reduce processing steps and time.

An embodiment of the present invention further dopes interconnects 234, 251 and 351 at the same time. For example, interconnects 234, 251 and 351 are all conductively doped silicon. An N+ material is doped into regions of the silicon to form the interconnects.

Conventional DRAMs include memory arrays with intersecting row and column lines coupled to individual storage cells. Conventional DRAMs include an externally generated power supply (Vcc) and a common ground. The devices of the DRAM use the common ground and power supply voltages in order to function properly. Typical DRAMs also include a voltage (Vccp) that is above the power supply that drives the word lines of the DRAM. Also, the semiconductor substrate of the DRAM is, in an embodiment, biased below common ground with a back bias voltage (Vbb). A biased substrate gives better control over threshold voltages, reduces transistor leakage, and guards against latch-up. As described herein, the present invention provides a back bias voltage to integrated circuit devices, e.g., transistors and capacitors, that form memory structures such as DRAMs in silicon-on-insulator (SOI) structures. It will be appreciated that the need for back bias voltages are not limited to DRAMs. Other memory structures require back bias voltages. Other memory structures include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging random access memory technologies.

Figure 4:
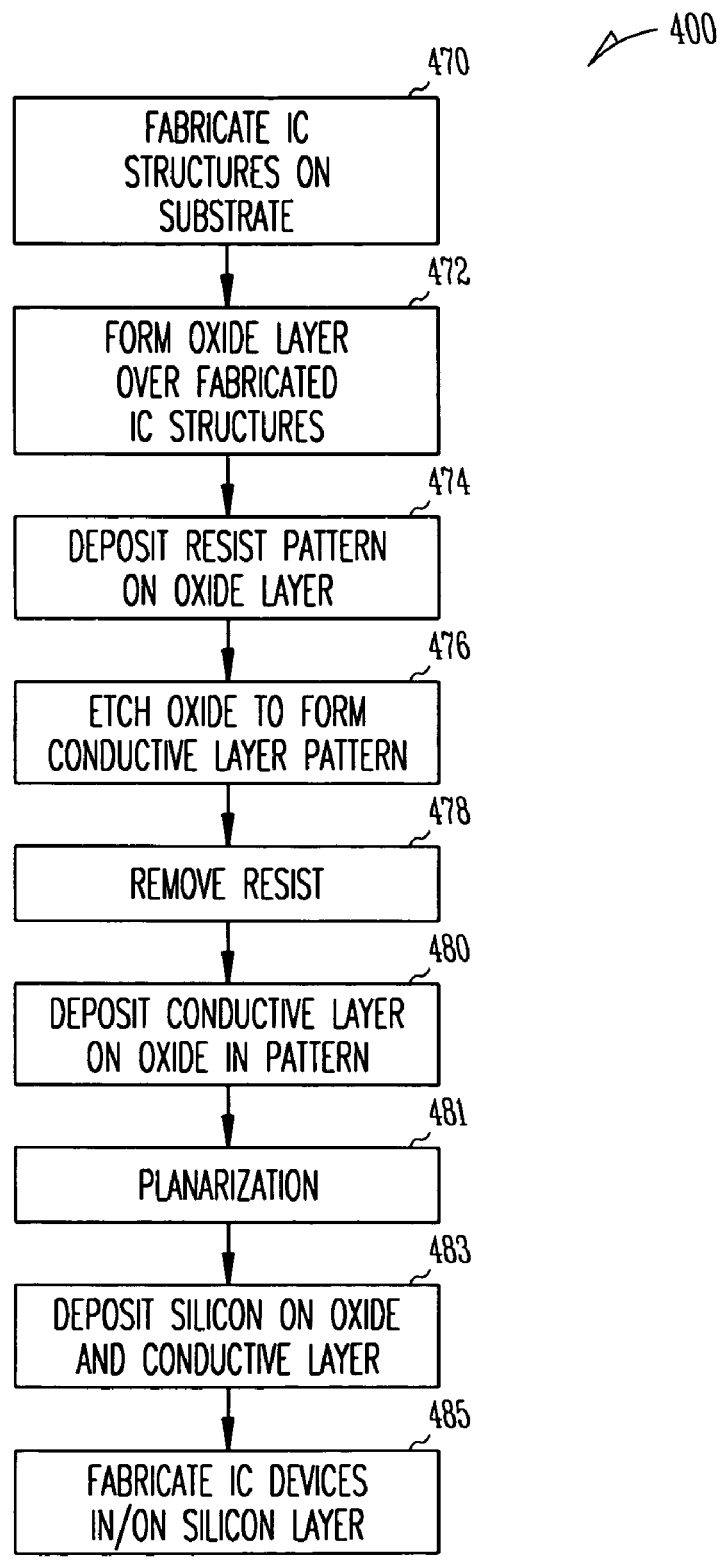
FIG. 4 is a flow chart showing a process according to the present invention.

FIG. 4 shows a method for fabricating a SOI structure 400 according to an embodiment of the present invention. The substrate is formed and integrated circuits structures are fabricated on the substrate, 470. In an embodiment, solid-state electrical energy storage devices are formed in the substrate. In an embodiment, the electrical energy storage devices are capacitors. In an embodiment, logic circuits are formed in the substrate. In an embodiment, transistors are formed in the substrate. An insulating layer is formed over the substrate, 472. In an embodiment, the insulating layer has a thickness of about 1,000 angstroms. In an embodiment, the insulating layer has a thickness of about 1 to 4 microns. In an embodiment, the insulating layer includes an oxide layer. In an embodiment, the oxide layer is a buried oxide layer and formed by SOI techniques. In an embodiment, the oxide layer covers the integrated circuit structures on the substrate. A resist layer is patterned on the insulating layer, 474. The insulating layer is etched to form a patterned recess for the conductive layer, 476. The etching process is dependent on the materials of the insulating layer. The etching compound is chosen to selectively etch the insulating layer. The recess(es) is patterned such that it will extend beneath select integrated circuit devices. In an embodiment, the recess has a depth of about 500 angstroms. The resist is removed, 478. A conductive material is deposited in the patterned recesses, 480. In an embodiment, the conductive material includes conductively doped silicon. In an embodiment, the silicon in the conductive layer is doped in situ. In an embodiment, the conductive material includes a metal. The upper surface, which is remote from the substrate, is planarized, 481. In an embodiment, planarization is performed by chemical-mechanical polishing. The planarization thins the conductive layer. Planarization further produces a uniform upper surface of the insulating layer and conductive layer on which a silicon layer is deposited. A silicon layer is formed on the planarized upper surface, 483. In an embodiment, the silicon layer is a wafer that is bonded to the upper surface. In an embodiment, a low temperature bonding process forms the silicon layer. The bonding process includes physically contacting a silicon substrate to the insulating and conductive layers on the substrate. In an embodiment, the bonding occurs at a temperature less than 1,000 degrees Celsius. In an embodiment, the bonding occurs at a temperature less than 900 degrees Celsius. In an embodiment, the bonding occurs at a temperature less than 800 degrees Celsius. In an embodiment, the bonding occurs at a temperature less than 600 degrees Celsius. In an embodiment, the bonding occurs at a temperature of about 550 degrees Celsius. In an embodiment, the bonding occurs at a temperature greater than 550 degrees Celsius. The conductive layer is adapted to deliver a bias voltage to the silicon layer, for example, at the base of the integrated circuit devices. The structure is now subjected to further integrated circuit fabrication steps, 485. These steps include fabricating transistors having bases in electrical communication with the conductive layer. Metal interconnects and traces are also fabricated.

Figure 5:
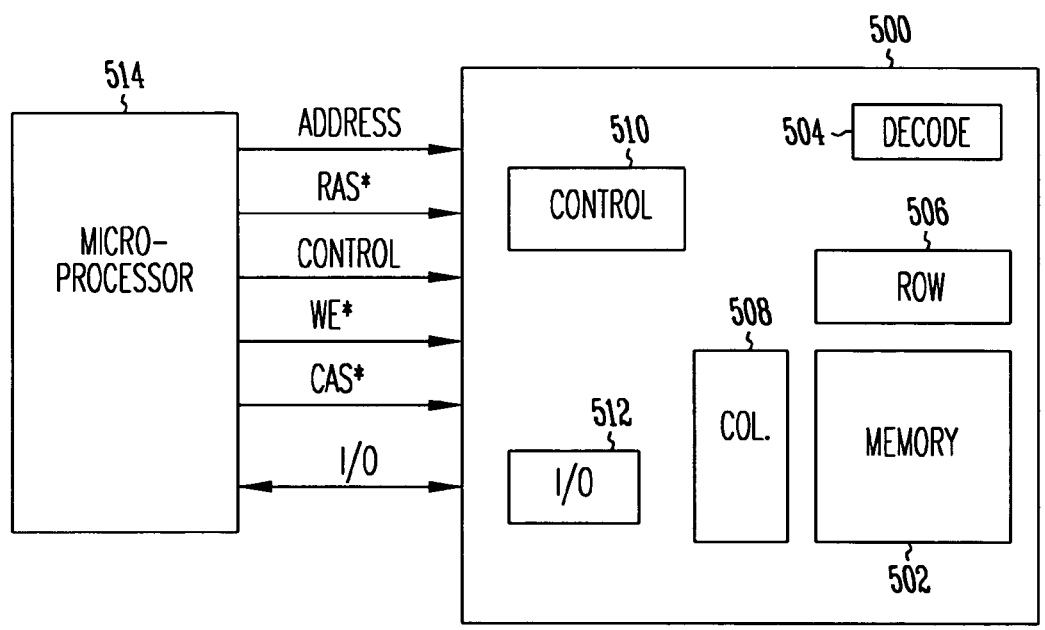
FIG. 5 is a view of a memory device according to the present invention.

FIG. 5 is a simplified block diagram of a memory device 500 according to an embodiment of the invention. The memory device 500 includes an array of memory cells 502, address decoder 504, row access circuitry 506, column access circuitry 508, control circuitry 510, and Input/Output circuit 512. The memory is operably coupled to an external microprocessor 514, or memory controller for memory accessing. The memory device 500 receives control signals from the processor 514, such as WE*, RAS* and CAS* signals. The memory device 500 stores data that is accessed via I/O lines. It will be appreciated by those skilled in the art that additional circuitry and control signals can be provided, and that the memory device of FIG. 5 has been simplified to help focus on the invention. At least one of the memory cells, transistors, or associated circuitry has an integrated circuit structure or element in accordance with the present invention. That is at least one of the integrated circuit structures is formed in a silicon layer that is part of a silicon-on-insulator structure. In an embodiment, the decoder circuits are formed on the silicon layer of a silicon-on-insulator structure according to the present invention. The conductive biasing layer 115, 215 or 315 back biases the transistors that perform the decoding logic functions. In an embodiment, the access circuits that are controlled by the decoder are formed on the silicon layer of a silicon-on-insulator structure according to the present invention. The conductive biasing layer 115, 215 or 315 back biases the access transistors.

It will be understood that the above description of a memory device is intended to provide a general understanding of the memory and is not a complete description of all the elements and features of a specific type of memory, such as DRAM (Dynamic Random Access Memory). Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

In an embodiment of the present invention the process steps described herein are stored in a computer readable format on a computer readable media. Examples of computer readable media include optical and magnetic storage media such as laser readable disks, magnetic disks and tape. Computer memory is a further example of computer readable media.

Figure 6:
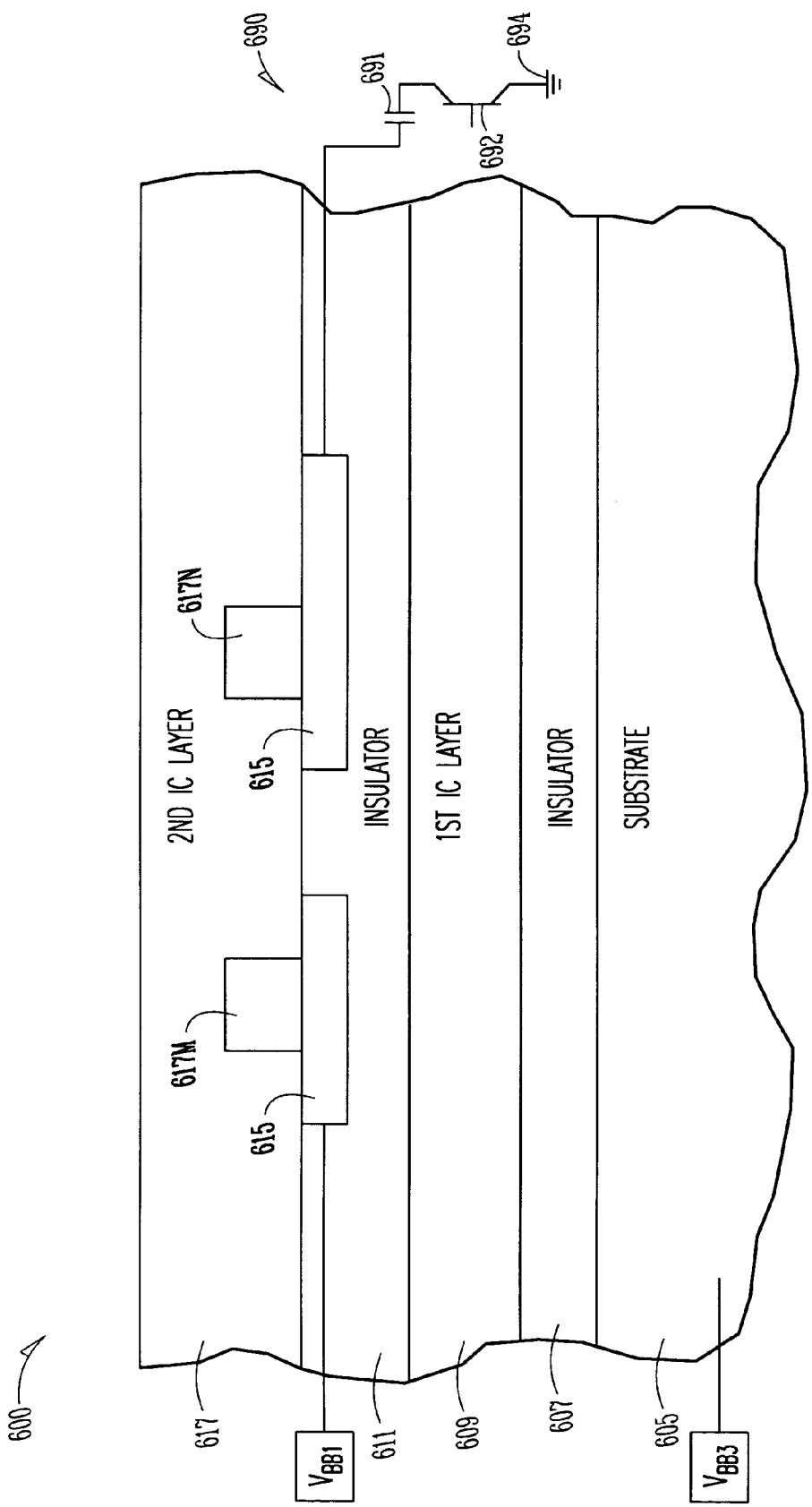
FIG. 6 shows a fragmentary cross-sectional view of a semiconductor structure according to an embodiment of the present invention.

FIG. 6 shows a semiconductor structure 600 according to an embodiment of the present invention. The semiconductor structure 600 includes a substrate 605 on which is formed an insulator layer 607. A first integrated circuit layer 607 is formed over the insulator layer 607. In an embodiment, the insulator layer 607 includes a biasing conductor layer (not shown) as described herein. A further insulator layer 609 is formed over the first integrated circuit layer 609. A conductive layer 615 is formed in the insulator layer 609. A further integrated circuit layer 617 is formed on both the insulator layer 609 and conductor layer 615. In an embodiment, the conductor layer 615 is adapted to bias at least portions of the integrated circuit layer 615. In an embodiment, the conductor layer 615 biases regions of integrated circuit devices 617M and 617N. In an embodiment, the conductor layer 615 includes a plurality of individual conductors, which can be connected to different voltage levels.

At least one of the individual conductors of the conductor layer 615 is electrically connected to a discharge circuit 690. Discharge circuit 690 is adapted to collect charge from the integrated circuit devices 617M, 617N of the integrated circuit layer 617 through the conductor layer 615. The discharge circuit 690, in an embodiment, is adapted to collect charge that accumulates in the body region of a transistor, which is at least one of the integrated circuit devices 617M, 617N. In an embodiment, discharge circuit 690 is connected to a voltage level 694. In an embodiment, the discharge circuit includes a capacitor 691. The capacitor 691 acts as a charge collector. Discharge circuit 690, in an embodiment, further includes a circuit that periodically connects the capacitor 691 to ground, which allows capacitor 691 to discharge its collected charge. In an embodiment, discharge circuit 690 includes a switch 692 that connects the capacitor 691 to ground. In an embodiment, the switch 692 includes a transistor. In an embodiment, the switch 692 is a transistor. In an embodiment, the transistor 692 is fabricated at the same time other transistors are fabricated in at least one of the integrated circuit levels 617, 609. In an embodiment, the voltage level 694 is ground. In operation, electrical charge accumulates in the body region of an integrated circuit device 617M or 617N. The charge accumulated in the body region is undesirable as the stored charge degrades performance of the integrated circuit device and may lead to latch up. The capacitor 690 attracts the charge from the body region through the conductor layer 615. The switch 692 periodically connects the capacitor 690 to ground 694 to discharge the capacitor 690. Thus, the charge accumulated in the body region is discharged without the conductor layer 615 being continuously connected to ground. That is, the conductor layer 615, in an embodiment, is floating and still connects the integrated circuit device 617M or 617N to a discharge device.

CONCLUSION

The present invention includes methods for producing improved SOI, IC structures as discussed herein. SOI provides improved operating speed and latchup prevention relative to conventional substrate integrated circuits. Moreover, SOI allows closer fabrication of p- and n-transistors, absent latchup problems and lower parasitic capacitances. The present invention further provides a structure that overcomes the "kink" effects that occur in SOI that lack a conducting substrate. The present invention provides a structure for biasing the back or base of a semiconductor layer that is on the insulator layer of a silicon-on-insulator structure. In an embodiment, a conductive layer is formed in the insulator layer. The conductive layer is insulated from the layers below the insulator layer. The conductive layer is in electrical contact with the semiconductor layer in which is formed the integrated circuit device. In an embodiment, the conductive layer is in electrical contact with the base layer of a transistor. The conductive layer is adapted to provide a back bias voltage to the transistor. The ability to apply an intended, designed bias voltage to the base of a semiconductor device such as a transistor helps prevent floating body effect and prevent latch-up.

In an embodiment, the conductive layer includes a plurality of electrically distinct conductors. In an embodiment, recesses are etched into the insulator layer formed in recesses etched into the insulator. Each of the plurality of electrically distinct conductors is connected to a separate voltage source that supplies a different bias voltage ($V_{BB}$). Thus, the bias voltage is selected for groups of semiconductor devices. This allows the circuit designer to use a plurality of bias voltages that are chosen for the individual group of semiconductor devices. The bias voltage is locally dependent on the circuit needs. The local bias voltages and providing bias voltages to individual groups of semiconductor devices provides flexibility in the control of the threshold voltage (Vt). The present invention further includes local interconnects for the bias voltage. As described with FIG. 3, local interconnects for the conductive layer are formed using the same interconnect structures as used for other devices, thus not additional processing steps are required to form the bias voltage interconnects.

While the above description uses $V_{BB}$ to indicate the back bias voltage, it will be understood that the voltage is not limited to conventional $V_{BB}$. Other values for $V_{BB}$ are available to set the bias voltage level.

We claim:

1. A method of forming a silicon-on-insulator structure, comprising:
   providing a silicon-on-insulator substrate;
   forming a recess in an insulator layer disposed on the silicon-on-insulator substrate;
   depositing a conductor in the recess that is electrically isolated from the substrate; and
   forming an active semiconductor device positioned directly over and having a body region in a direct abutting relationship with the conductor, wherein the semiconductor device is contiguous with the silicon-on-insulator substrate.

2. The method of claim 1, wherein providing the silicon-on-insulator substrate includes forming the insulator layer by forming a buried oxide layer in the substrate.

3. The method of claim 2, wherein forming the recess includes etching into the buried oxide layer to form the recess.

4. The method of claim 1, wherein depositing the conductor includes depositing a conductive polysilicon in the recess.

5. The method of claim 1, wherein forming a semiconductor device includes forming a body region of the semiconductor device in electrical contact with the conductor, the conductor being adapted to provide a biasing voltage to the body region.

6. The method of claim 5, wherein depositing the conductor includes connecting the conductor to a bias voltage source.

7. A method, comprising:
   providing a substrate;
   forming an insulator layer on the substrate;
   forming a plurality of mutually spaced-apart conductors in the insulator layer, wherein the conductors are individually configured to be coupled to a selected voltage potential and are electrically insulated from the substrate;
   forming a silicon layer abutting the insulator layer and the conductors;
   forming an active integrated circuit device having a body region in the silicon layer; and
   wherein forming the active integrated circuit device includes forming the body region positioned directly above and abutting a selected one of the conductors to provide electrical contact with the conductors.

8. The method of claim 7, wherein providing the substrate includes fabricating at least one further integrated circuit device in the substrate.

9. The method of claim 8, wherein forming the integrated circuit device includes electrically connecting the integrated circuit device with the further integrated circuit device.

10. The method of claim 7, wherein forming the conductor includes planarizing an upper surface of the conductor and insulator layer, and thereafter forming the silicon layer on the planarized upper surface.

11. The method of claim 7, wherein forming the conductor includes annealing conductive material in the insulator layer.

12. The method of claim 7, wherein forming the insulator layer includes forming a recess in the insulator layer.

13. The method of claim 12, wherein forming the conductor includes depositing a conductive polysilicon in the recess.

14. The method of claim 12, wherein forming the recess includes etching a recess to a depth of about 500 angstroms.

15. A method, comprising:
   providing a substrate;
   forming an insulator layer on the substrate;
   depositing a patterned resist on the insulator layer;
   etching the insulator layer in areas of the insulator not covered by resist to form a plurality of mutually spaced-apart recesses;
   depositing conductors in the recesses, wherein the conductors are configured to be individually coupled to selected voltage potentials and are electrically insulated from the substrate;
   forming a silicon layer abutting the insulator layer and the conductor;
   forming an active integrated circuit device having a body region in the silicon layer; and
   wherein forming the integrated circuit device includes forming the body region positioned directly above and abutting a selected one of the conductors to provide electrical contact with the conductor.

16. The method of claim 15, wherein forming the silicon layer includes planarizing an upper surface of the insulator layer and the conductor.

17. The method of claim 16, wherein planarizing includes chemical-mechanical planarizing.

18. The method of claim 15, wherein depositing the conductor includes depositing a conductive material in the recess and removing the resist.

19. The method of claim 15, wherein forming the integrated circuit includes doping a first source/drain region of the silicon layer and doping a second source/drain region of the silicon layer.

20. The method of claim 19, wherein the first source/drain region and the second source/drain region are physically spaced and electrically open from the conductor.

21. A method of forming a silicon-on-insulator device, comprising:
   providing a substrate;
   forming an insulator in contact with the substrate;
   patterning the insulator to form more than one conductive portion within the insulator, the conductive portions being mutually spaced-apart and configured to provide a local voltage bias, wherein the conductive portions are electrically insulated from the substrate;
   forming a silicon layer that abuts the insulator that contacts the insulator and the more than one conductive portion; and
   forming at least one active integrated circuit device in the silicon layer that is positioned directly vertically above and having a body region in a direct abutting relationship with at least one of the conductive portions.

22. The method of claim 21, wherein patterning the insulator comprises planarizing the insulator and the at least one conductive portion.

23. The method of claim 21, wherein patterning the insulator comprises:
   depositing a resist pattern on the insulator;
   etching the insulator to form at least one recess;
   removing the resist; and
   depositing a conductive material into the at least one recess to form the at least one conductive portion.

24. The method of claim 23, wherein depositing a conductive material into the at least one recess comprises depositing a layer of polysilicon into the at least one recess.

25. The method of claim 21, wherein forming at least one integrated circuit device comprises forming at least one of a transistor, a charge storage device, and a logic circuit.

26. A method of forming a silicon-on-insulator semiconductor device, comprising:
providing a substrate;
forming an insulator in contact with the substrate;
forming a patterned conductor within the insulator defining a plurality of voltage biasing portions, wherein the patterned conductor is electrically insulated from the substrate;
applying a silicon layer on the insulator that abuts the insulator and the patterned conductor;
forming at least one active integrated circuit device in the silicon layer positioned directly vertically above and having a body region in a direct abutting relationship with one of the plurality of voltage biasing portions; and
coupling a discharge circuit to the at least one integrated circuit device.

27. The method of claim 26, wherein forming at least one integrated circuit device comprises forming an integrated circuit device that includes a body region.

28. The method of claim 27, wherein forming an integrated circuit device that includes a body region comprises coupling the discharge circuit to the body region.

29. The method of claim 26, wherein coupling a discharge circuit to the at least one integrated circuit device comprises coupling a charge storage device to the integrated circuit device.

30. The method of claim 29, wherein coupling a charge storage device to the integrated circuit device comprises coupling a switch to the charge storage device to interruptably couple the charge storage device to a selected potential.

31. The method of claim 26, wherein coupling a discharge circuit to the at least one integrated circuit device comprises coupling the discharge circuit to a ground potential.

32. The method of claim 30, wherein coupling a switch to the charge storage device comprises coupling a transistor to the charge storage device that couples the charge storage device to a ground potential.

33. A method of fabricating a silicon-on-insulator structure, comprising:
providing a substrate;
forming at least one active integrated circuit device on the substrate;
forming an insulator layer abutting the substrate;
providing at least one recess in the insulator layer and depositing a conductive material in the at least one recess to define at least one voltage biasing portion;
depositing a layer of a semiconductor material on the insulator layer and the at least one voltage biasing portion, wherein the at least one voltage biasing portion is electrically insulated from the substrate;
forming at least one active integrated circuit device positioned directly vertically above and having a body region in a direct abutting relationship with the voltage biasing portion; and
forming a discharge device coupled to the at least one integrated circuit device.

34. The method of claim 33, wherein forming at least one integrated circuit device on the substrate comprises forming an integrated circuit device having a body region that is further coupled to the discharge device.

35. The method of claim 33, wherein forming a discharge device coupled to the at least one integrated circuit device comprises forming a charge storage device that is coupled to a selected potential.

36. The method of claim 35, wherein forming a charge storage device that is coupled to a selected potential comprises forming the charge storage device that is interruptably coupled to a ground potential.

37. The method of claim 36, wherein forming the charge storage device to that is interruptably coupled to a ground potential comprises forming a transistor that may be interruptably biased to couple the charge storage device to the ground potential.

38. The method of claim 33, wherein forming a discharge device coupled to the at least one integrated circuit device comprises forming the discharge device and the at least one integrated circuit device at the same time.

39. The method of claim 35, wherein forming a charge storage device that is coupled to a selected potential comprises forming a capacitor coupled to a selected potential.

40. The method of claim 39, wherein forming a capacitor coupled to a selected potential includes coupling the capacitor to a charge sink.

* * * * *

UNITED STATES PATENT AND TRADEMARK OFFICE
CERTIFICATE OF CORRECTION

PATENT NO. : 7,659,152 B2  Page 1 of 1
APPLICATION NO. : 10/930001
DATED : February 9, 2010
INVENTOR(S) : Fernando Gonzalez et al.

It is certified that error appears in the above-identified patent and that said Letters Patent is hereby corrected as shown below:

In column 16, line 30, in Claim 37, after "device" delete "to".

Signed and Sealed this

Eighteenth Day of May, 2010

David J. Kappos
*Director of the United States Patent and Trademark Office*